United States Patent
Chait et al.

(10) Patent No.: US 9,618,538 B2
(45) Date of Patent: Apr. 11, 2017

(54) DUAL-FUNCTION SWITCH AND LEAD SET FOR ELECTRICAL INSTRUMENT PROBES

(71) Applicants: Paul Nicholas Chait, San Rafael, CA (US); Stanley Chait, New York, NY (US)

(72) Inventors: Paul Nicholas Chait, San Rafael, CA (US); Stanley Chait, New York, NY (US)

( * ) Notice: Subject to any disclaimer, the term of this patent is extended or adjusted under 35 U.S.C. 154(b) by 0 days.

(21) Appl. No.: 14/696,215

(22) Filed: Apr. 24, 2015

(65) Prior Publication Data
US 2015/0309077 A1    Oct. 29, 2015

Related U.S. Application Data

(60) Provisional application No. 61/983,810, filed on Apr. 24, 2014.

(51) Int. Cl.
*H01H 31/02* (2006.01)
*G01R 15/12* (2006.01)
*G01R 15/00* (2006.01)

(52) U.S. Cl.
CPC ......... *G01R 15/125* (2013.01); *G01R 15/002* (2013.01)

(58) Field of Classification Search
CPC .... G01R 15/002; G01R 15/08; G01R 15/125; G01R 13/20; G01R 13/257; G01R 19/14; G01R 1/0408; H01J 31/14; H03J 3/14
USPC .............................. 324/555, 115–116, 121 R
See application file for complete search history.

(56) References Cited

U.S. PATENT DOCUMENTS

| | | | | |
|---|---|---|---|---|
| 2,229,927 A | * | 1/1941 | Kamper | G01R 31/026 324/556 |
| 3,213,365 A | * | 10/1965 | Wilson | G01R 1/22 324/115 |
| 3,213,366 A | * | 10/1965 | Eadie, Jr. | G01R 15/08 324/115 |
| 9,046,564 B1 | * | 6/2015 | Griffin | G01R 31/20 |
| 2007/0214872 A1 | * | 9/2007 | Ammann | G01N 27/4165 73/53.01 |

FOREIGN PATENT DOCUMENTS

BR    201107180 A2 * 10/2013

* cited by examiner

*Primary Examiner* — Patrick Assouad
*Assistant Examiner* — Demetrius Pretlow
(74) *Attorney, Agent, or Firm* — Larry D. Johnson

(57) ABSTRACT

For decades, a mainstay of electrical and electronic testing has been the conventional use of the multi-meter that used a pair of probes to connect the Device Under Test to the meter. This often proves inadequate for present-day testing because more than one simultaneous or alternate reading or the connection of another testing tool and the reading of its effect on the DUT is often required. The Dual-Function Switch and Lead set (DFSL) of the present invention provides a switch and lead set interfacing two multi-meters, or one multi-meter and one test device or instrument with the DUT, while using the traditional and convenient pair of probes and a simple finger movement on the DFSL. The DFSL facilitates these tests, their safety and integrity, and reduces the time of many test procedures.

12 Claims, 6 Drawing Sheets

DUAL-FUNCTION SWITCH AND LEAD SET FOR ELECTRICAL INSTRUMENT PROBES

CROSS REFERENCE TO RELATED APPLICATIONS

The present application claims the benefit of the filing date of U.S. Provisional Patent Application Ser. No. 61/983, 810, filed Apr. 24, 2014. The foregoing application is incorporated by reference in its entirety as if fully set forth herein.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates generally to electrical test instrument probes, and more particularly to a dual-function switch and lead set for electrical instrument probes.

BACKGROUND INFORMATION AND DISCUSSION OF RELATED ART

Digital and analog multi-meters measure and display a wide variety of electrical functions within one meter. These functions can include AC and DC volts, amperes, ohms, frequency, temperature and many other measurements and are selectable with a switch, usually rotary, on the instrument.

The traditional interface between a multi-meter and the Device Under Test (DUT) is made with the use of a pair of probes, with one probe held in each hand and commonly referred to as positive and negative, with a contact on the tip of each probe being either a point or a clip (clamp, alligator) that contacts the DUT. On the plastic housing of the probe there is a plug-in socket to accommodate a single conductor flexible lead, with the other end of the lead plugging into a socket on the multi-meter. Therefore one of the probes with its lead plugs into the positive socket of the multimeter and the other probe with its lead plugs into the negative socket of the multimeter. Probes can be of many types that are commercially available from various manufacturers, but all perform the same task of connecting the meter with the DUT.

In traditional operation, the user must determine the required test function and pre-set the multi-meter rotary switch to the appropriate position. However, if the user wishes to change functions such as to initially read DC volts, then switch to AC volts, the user must interrupt the test and, usually with the probe in-hand, re-position the multi-meter rotary switch, then return the probe tip to the DUT. These interruptions can compromise continuity and possibly the safety of a test procedure.

For example, to utilize two multi-meters or one multi-meter and a resistor or capacitor would require connecting two pairs of leads (four probes) or a pair of probes and another pair of clip-leads to the DUT. This procedure can be difficult or awkward and possibly damaging to the DUT.

The foregoing information reflects the current state of the art of which the present inventor is aware. Reference to, and discussion of, this information is intended to aid in discharging Applicant's acknowledged duty of candor in disclosing information that may be relevant to the examination of claims to the present invention. However, it is respectfully submitted that none of the above-indicated information discloses, teaches, suggests, shows, or otherwise renders obvious, either singly or when considered in combination, the invention described and claimed herein.

SUMMARY OF THE INVENTION

The Dual-Function Switch and Lead set (DFSL) of the present invention uniquely interfaces two multimeters or one multimeter and one measurement or test instrument such as a load or signal generator. The DFSL allows two multi-meters or other electrical test tools to alternately or simultaneously be used without the necessity of removing the probe from its placement on the device under test (DUT). While the following discussion is weighted toward the use of two multimeters, the invention also applies to combinations of many other electrical testing apparatus and devices such as oscilloscopes and temperature sensors.

The invention provides a switch and two specialized lead wires for connection to multi-meters or other testing tools, one lead wire for the switched probe and the other for the un-switched probe. The following discussion uses the conventional negative, often called 'ground' or 'common', as the un-switched probe, but the invention can also be used with a common positive.

Leads on probe end: A switch unit incorporated into one of the two DFSL probe leads (usually the positive lead) that plugs into to a commercially available probe set.

Leads on test equipment end: Two sets of leads that connect to two multi-meters or other test equipment.

Positive Probe (switched): The probe switch unit contains a switch, described below, that has two leads emanating from the switch contacts as a single two conductor wire, with the two conductors branching out in a 'T' configuration near the multi-meter so that each conductor separately plugs into the positive socket of one of two multi-meters.

Negative Probe (not switched, common): The negative probe lead is a single conductor that also branches out in a 'T' configuration near the multi-meters. Each split-out of this single conductor plugs into the negative socket of each meter and thereby allows the negative probe, negative of meter A, and negative of meter B to all connect to each other as a common connection.

Switching: The probe switch allows the positive probe to be independently selected to either the positive of multi-meter A or the positive of multi-meter B, as determined by the user. The probe switch is a single pole double throw switch that operates in a 'break before make' mode so that the unused meter never receives a signal during switching.

Paralleling Over-ride: The Probe Switch in the unit also has an over-ride position that connects A and B positives together. When the over-ride position is in use, both meters are connected in parallel. Both meters therefore simultaneously receive the same signal during the over-ride mode. Paralleling Over-ride can be accomplished by an additional contact position on the Probe Switch or a separate paralleling switch. Either method of paralleling A and B positives can be momentary or maintained. The switch actuator may be embodied such as a toggle, rocker, slide, lever, or other acuator.

Using the DFSL in place of a traditional lead set enables (1) Two meters to display independent readings; (2) Two meters to display different ranges of the same function; (3)

Use of one meter coupled with various analyzers, sensors, and electrical and electronic testing tools; (4) Testing of a battery coupled with a load; (5)"Off" position directly at probe when using only one multi-meter; and (6) Paralleling two meters for comparison, verification of reading, and calibration.

It is therefore an object of the present invention to provide a new and improved dual-function switch and lead set for electrical instrument probes.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based readily may be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application, which is measured by the claims, nor is it intended to be limiting as to the scope of the invention in any way.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 1A:
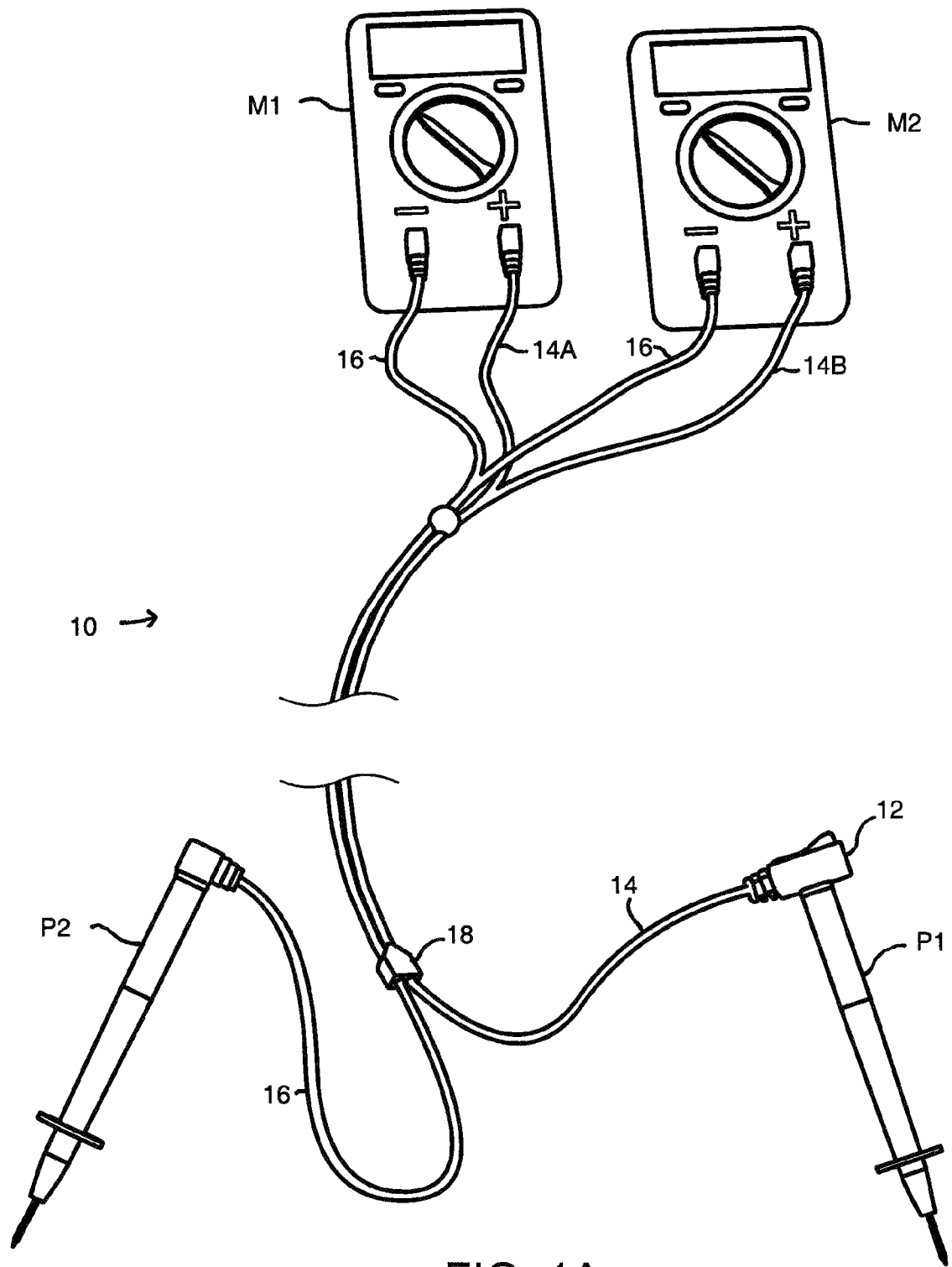
FIG. 1A is an overview of a DFSL plugged into a pair of conventional probes and two multi-meters.

Referring to FIGS. 1A through 5, wherein like reference numerals refer to like components in the various views, there is illustrated therein a new and improved dual-function switch and lead set for electrical instrument probes, generally denominated 10 therein.

FIG. 1A is an overview of a DFSL 10 plugged into a pair of conventional probes P1, P2 and two multi-meters M1, M2 indicating the lead arrangement. The DFSL 10 provides a switch 12 and two specialized lead wires for connection to multi-meters or other testing tools, a two-conductor lead wire 14 for the switched probe P1 and a single conductor lead wire 16 for the un-switched probe P2. The switch 12 has two leads emanating from the switch contacts connected to the two conductor lead wire 14, with the two conductors separately branching out in a 'T' configuration near the multi-meters so that conductor 14A plugs into the positive socket of multi-meter M1, and conductor 14B plugs into the positive socket of multi-meter M2. The negative probe lead 16 is a single conductor that also branches out in a 'T' configuration near the multi-meters. Each split-out of this single conductor plugs into the negative socket of each meter and thereby allows the negative probe, the negative of meter M1 and the negative of meter M2 to all connect to each other as a common connection.

The leads at the probe ends are shown with a tab or zipper 18 (such as seen on reusable plastic bags) that can be used to adjust the lead separation to whatever distance is required by the user to reduce the tangling of leads that often happen even with conventional leads of one conductor each.

Figure 1B:
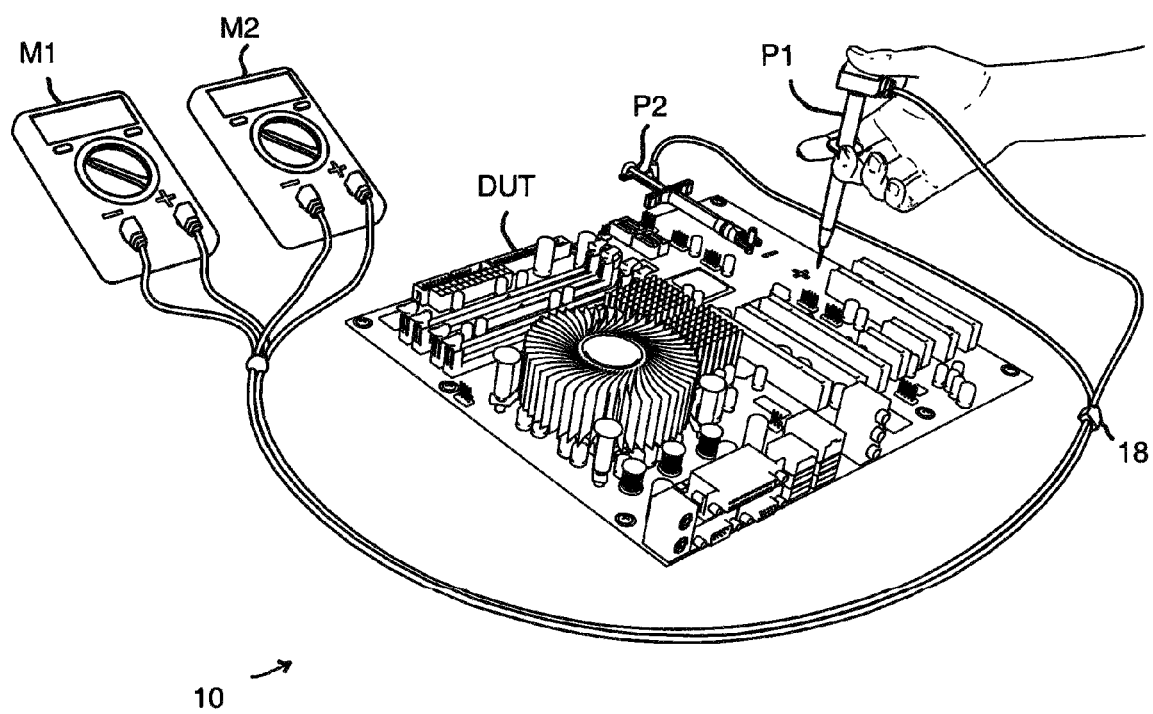
FIG. 1B shows a DFSL in a type of bench test that allows one probe clamped to a terminal the device under test DUT, while the other probe can be used for readings on the multi-meters.

FIG. 1B shows the DFSL in a type of bench test that allows one probe P2, usually negative, to be clamped to a terminal or component of the device under test DUT, usually a common or ground, while the other positive probe P1 can be used for readings on the multi-meters. This can leave one hand free for setting further readings, switching a DUT, etc. The zipper 18 is also shown.

Figure 2A:
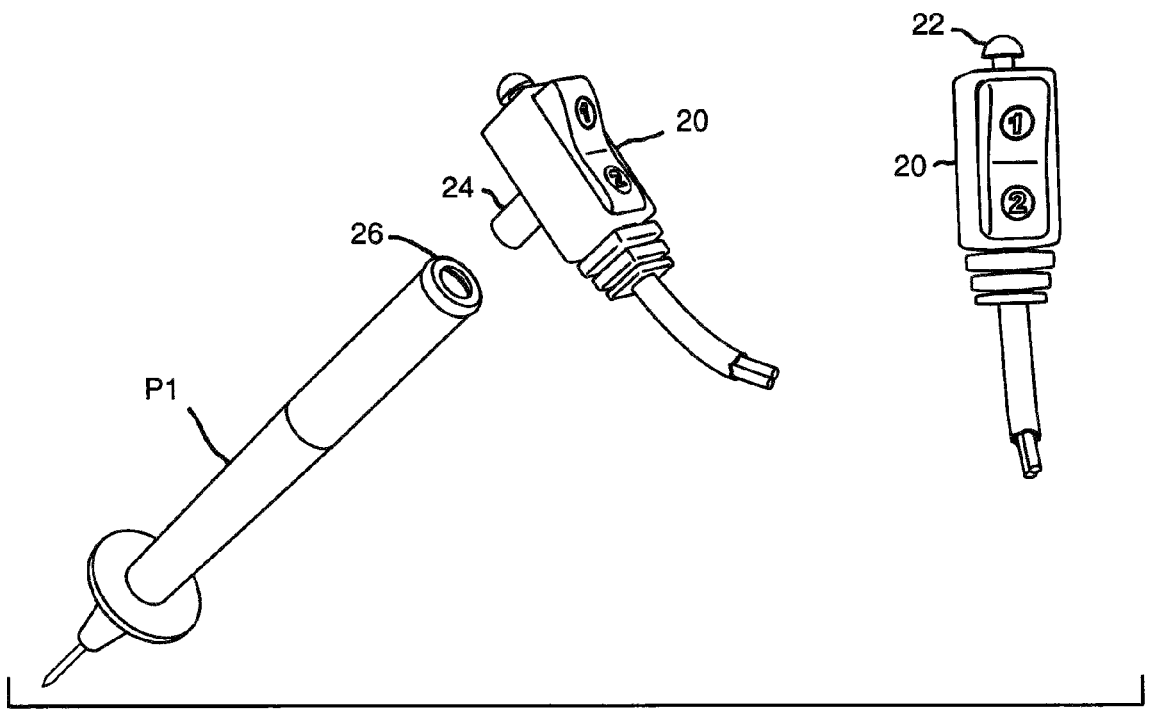
FIG. 2A shows a rocker type DFSL switch.

FIG. 2A shows a rocker type DFSL switch 20 to select the desired circuit, with a separate button switch 22 for the over-ride position that parallels the two positions (selecting both circuits). Plug 24 releasably connects to probe socket 26.

Figure 2B:
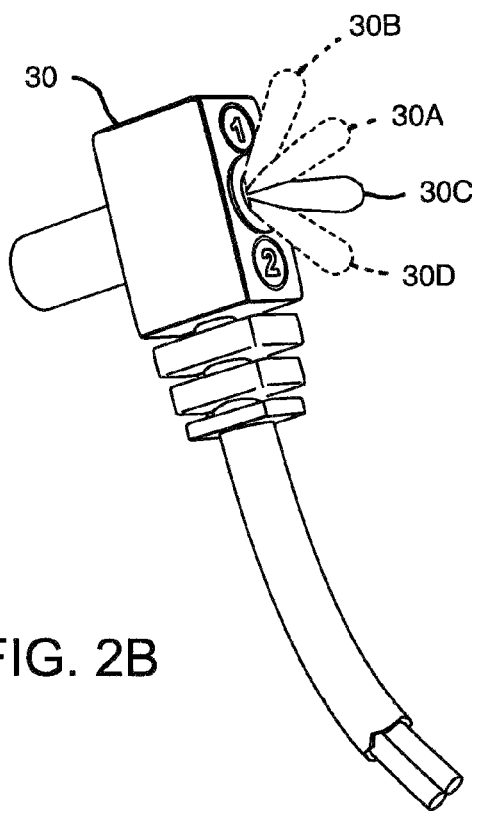
FIG. 2B shows a toggle type DFSL switch.

FIG. 2B shows a toggle type DFSL switch 30. When the toggle is set to position 30A (e.g., circuit 1) a further pressing of the toggle to position 30B will parallel the two meters or devices connected to the DFSL while held in that position. Upon release the switch reverts to position 30A. Similarly, when the toggle is set to position 30C (e.g., circuit 2) a further pressing of the toggle to position 30D will parallel the two meters or devices connected to the DFSL while held in that position, and upon release the switch reverts to position 30C. Numbers, color dots, or other indicia on each switch denotes the switch position, supplementing the feel of the switch to the operator.

Figure 3A:
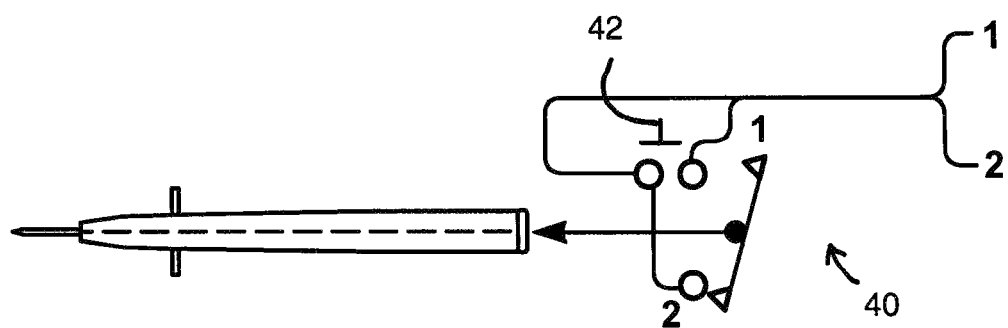
FIG. 3A is a DFSL schematic diagram indicating a single pole 2 position switch with position 2 (for circuit 2) selected.
Figure 3B:
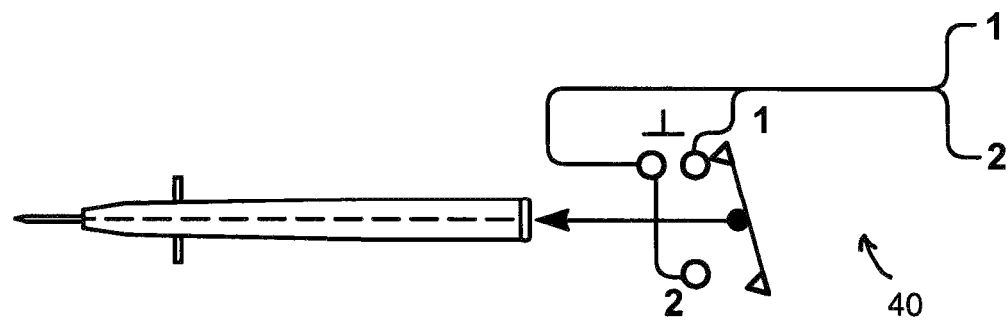
FIG. 3B is a diagram indicating the single pole 2 position switch with position 1 (for circuit 1) selected.

FIG. 3A is a DFSL schematic diagram indicating a single pole 2 position switch 40 with position 2 (for circuit 2) selected, with an over-ride paralleling button 42, such that when the button is pressed, both circuits 1 and 2 are selected. The button does not necessarily indicate that it is a momentary switch and embodiments of the switch can be either momentary or maintained either in the switch or externally. FIG. 3B is a diagram indicating the single pole 2 position switch 40 set with position 1 (for circuit 1) selected.

Figure 4:
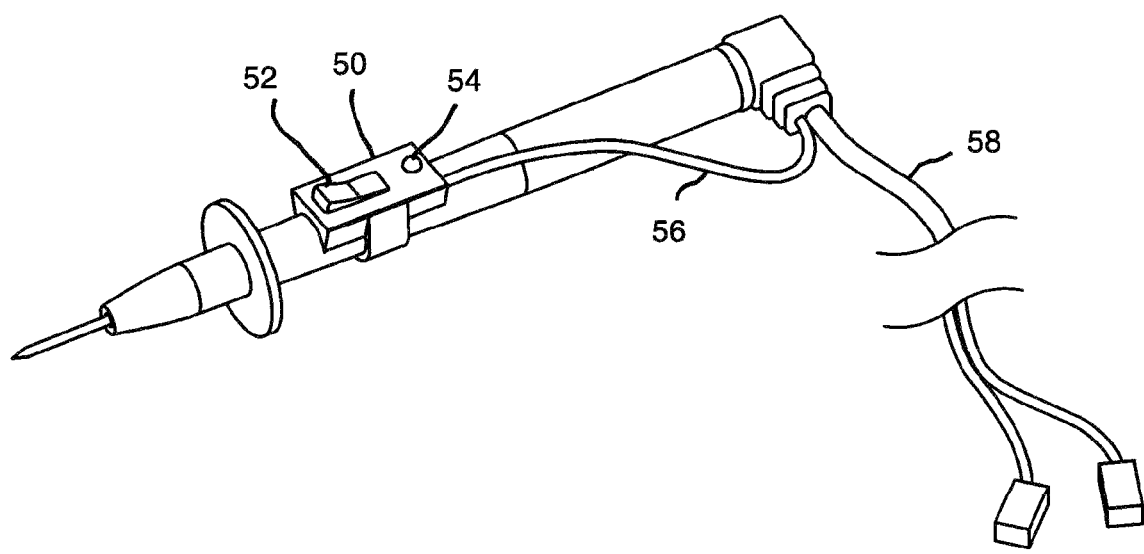

FIG. 4 shows an embodiment of a clamp-on DFSL 50 with switch 52 and override button 54 that is not plugged directly into the probe but can be mounted or attached to the probe housing in a location convenient to the user. Alternatively, the DFSL switch can be placed in a separate housing or other structure near the multimeters, or on the test leads themselves, instead of on the probe. An extension lead 56 from the switch 50 plugs into the probe socket and another two conductor lead 58 goes to the multi-meters or test devices.

Figure 5:
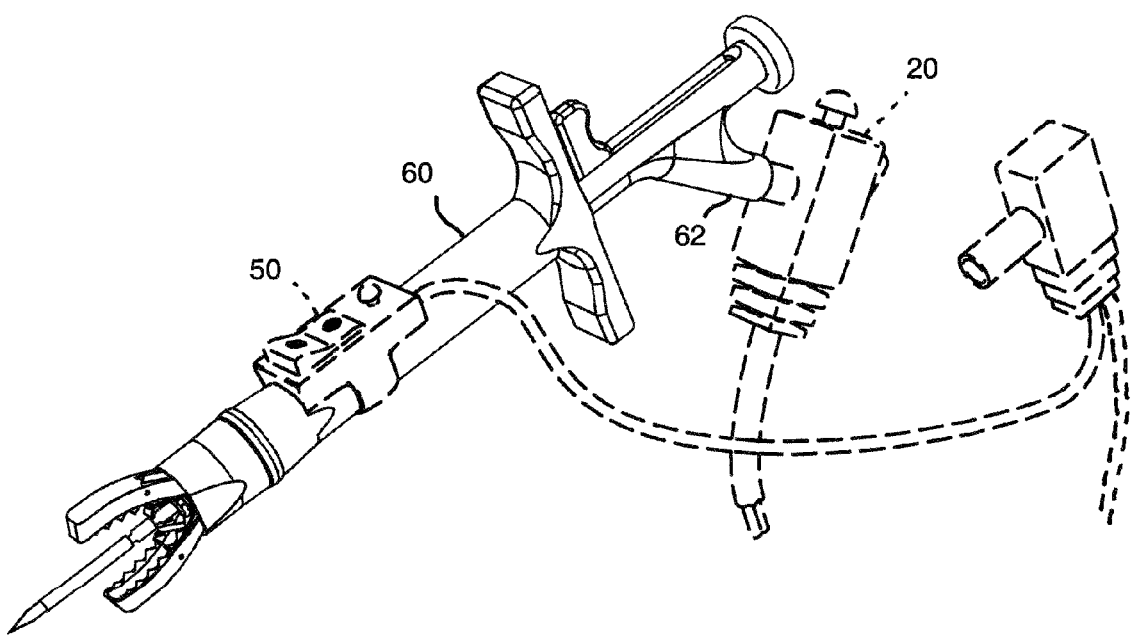
FIG. 5 shows two types of DFSL mountings on a dual-action type of probe.

FIG. 5 shows two types of DFSL mountings on a dual-action type of probe 60, and indicates that a socket plug-in type of DFSL such as rocker type switch 20 may be used with this type of plug-in probe that may have an offset socket 62. If this is inconvenient for the user's thumb position, the housing mounted type DFSL 50 may be used. The probe shown is also of the latest dual-action type whereby the user may deploy either a point or clamp with automatic retraction of the unused tip. This further increases the testing options available by the DFSL.

Accordingly, the dual-function switch and lead set of this invention may be characterized as a switch and lead set apparatus for use with a pair of electrical test tools, comprising: a switch member adapted for connection to a first electrical test probe, the switch member selectively connectable to a first lead only, a second lead only, and both said first lead and said second lead combined; the first lead adapted for connection to a first polarity socket on a first electrical test tool; the second lead adapted for connection to a first polarity socket on a second electrical test tool; and a third lead adapted to connect a second electrical test probe to a second polarity socket on the first electrical test tool and a second polarity socket on the second electrical test tool.

Advantages of the invention include, but are not limited to:

1. Two meters to display independent readings: Meters may each be set to different functions and the reading will be displayed by actuating the probe switch to either position #1 or position #2. The two functions can be measured alternately. Therefore a DUT having a common negative can have two separate positive probe placements and two separate meter readings can be obtained. Colors such as red and orange, and/or numbering or lettering on the switch and meter leads denote the selected meter.

2. Two meters to display different ranges of the same function. Multi-meters can be set to different ranges of the same function to determine the accuracy of a reading from low to high values, thus extending the range of accuracy of an instrument especially if the instrument does not have an auto-ranging feature. An example of the range switching is multi-meter #1 set to volts and multi-meter #2 set to milli-volts. On wide-ranging voltages, the low voltage setting will provide an accuracy in millivolts that is not available on a higher range of the meter.

3. Use of one meter coupled with various analyzers, sensors, and electrical and electronic testing tools. The probe switch allows testing with a combination of instrument and testing device such as a load or signal input. For example, while observing changes in voltage, current, frequency, etc. with a multi-meter on position #1, a resistive or capacitive load can be switched on and off when connected to #2 by actuating the Paralleling Over-Ride position. Therefore the reading can be made with and without a load or signal. This type of test is often used and accomplished by a cumbersome combination of probe and clip-leads and is therefore greatly facilitated by the DFSL.

4. Testing of a battery coupled with a load. The use of a multi-meter set to DC volts is often used to read battery voltages and voltage drops. Using the DFSL Paralleling Over-Ride connects a resistive load to a battery and allows the meter to observe voltage drops and voltage change with various loads and the recovery time when the load is switched-off and can be used to determine the State of Charge and health of the battery.

5. "Off" position directly at probe when using only one multi-meter. Using only one multi-meter if the meter probes are clamped to the DUT, the user may want to change the multi-meter switch to various positions. However, the placement of a function on the multi-meter rotary switch may entail a travel through inappropriate functions such as Volts being imposed on an Ohm position. This can result in meter damage or a blown meter fuse especially in analog meters. Therefore instead of removing one of the probe clamps, the user can switch from the connected 1 position to the open 2 position, change functions at the meter and return to #1 at the probe.

6. Paralleling two meters for comparison, verification of reading, and calibration. An important asset of the DFSL and its use of only one pair of probes is the ability to easily compare the readings of two meters when each is set to the same function. By actuating the probe switch, meters may be read alternately and by using the Paralleling Over-Ride, both meters may be read simultaneously. Therefore, verification of meter accuracy can be determined if one meter's accuracy is known. If known meter is certified and calibrated traceable to a facility such as the National Institute of Standards and Testing (NIST), the unknown meter may be deemed accurate.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like. Therefore, the above description and illustrations should not be construed as limiting the scope of the invention, which is defined by the appended claims.

What is claimed as invention is:

1. A switch and lead set apparatus for use with a pair of electrical test tools, said apparatus comprising:
 a switch member adapted for connection to a first electrical test probe, said switch member selectively connectable to a first lead only, a second lead only, and both said first lead and said second lead combined, said switch member comprising a single pole double throw switch and including a paralleling switch;

said first lead adapted for connection to a first polarity socket on a first electrical test tool;

said second lead adapted for connection to a first polarity socket on a second electrical test tool; and a third lead adapted to connect a second electrical test probe to a second polarity socket on said first electrical test tool and a second polarity socket on said second electrical test tool.

2. The switch and lead set apparatus of claim 1 wherein said electrical test tool comprises a multimeter.

3. The switch and lead set apparatus of claim 1 wherein said first lead and said second lead comprise a two conductor wire.

4. The switch and lead set apparatus of claim 1 wherein said third lead comprises a single conductor wire.

5. A switch and lead set apparatus for use with a pair of electrical test tools, said apparatus comprising:

a switch member adapted for connection to a first electrical test probe, said switch member selectively connectable to a first lead only, a second lead only, and both said first lead and said second lead combined, said switch member comprising a rocker switch including an override button to connect both said first lead and said second lead;

said first lead adapted for connection to a first polarity socket on a first electrical test tool;

said second lead adapted for connection to a first polarity socket on a second electrical test tool; and a third lead adapted to connect a second electrical test probe to a second polarity socket on said first electrical test tool and a second polarity socket on said second electrical test tool.

6. The switch and lead set apparatus of claim 5 wherein said electrical test tool comprises a multimeter.

7. The switch and lead set apparatus of claim 1 wherein said first lead and said second lead comprise a two conductor wire.

8. The switch and lead set apparatus of claim 1 wherein said third lead comprises a single conductor wire.

9. A switch and lead set apparatus for use with a pair of electrical test tools, said apparatus comprising:

a switch member adapted for connection to a first electrical test probe, said switch member selectively connectable to a first lead only, a second lead only, and both said first lead and said second lead combined, said switch member comprising a toggle switch having a first position, second position, third position, and fourth position;

said first lead adapted for connection to a first polarity socket on a first electrical test tool;

said second lead adapted for connection to a first polarity socket on a second electrical test tool; and a third lead adapted to connect a second electrical test probe to a second polarity socket on said first electrical test tool and a second polarity socket on said second electrical test tool, wherein when said toggle switch is set to said first position for testing a first circuit, a further pressing of said toggle switch to said second position will parallel said first and second electrical test tools, and upon release said toggle switch reverts to said first position, and when said toggle switch is set to said third position for testing a second circuit, a further pressing of said toggle switch to said fourth position will parallel said first and second electrical test tools, and upon release said toggle switch reverts to said third position.

10. The switch and lead set apparatus of claim 5 wherein said electrical test tool comprises a multimeter.

11. The switch and lead set apparatus of claim 1 wherein said first lead and said second lead comprise a two conductor wire.

12. The switch and lead set apparatus of claim 1 wherein said third lead comprises a single conductor wire.

* * * * *